US008122428B2

(12) United States Patent
Dharmagadda

(10) Patent No.: US 8,122,428 B2
(45) Date of Patent: Feb. 21, 2012

(54) METHODS AND APPARATUS FOR AUTOMATION AND FACILITATING DESIGN OF REGISTER MAPS

(75) Inventor: Tushneem Dharmagadda, Woburn, MA (US)

(73) Assignee: Analog Devices, Inc., Norwood, MA (US)

( * ) Notice: Subject to any disclaimer, the term of this patent is extended or adjusted under 35 U.S.C. 154(b) by 1211 days.

(21) Appl. No.: 11/821,847

(22) Filed: Jun. 26, 2007

(65) Prior Publication Data

US 2009/0007058 A1    Jan. 1, 2009

(51) Int. Cl.
*G06F 9/44* (2006.01)
*G06F 9/45* (2006.01)

(52) U.S. Cl. .................. 717/104; 717/105; 711/101

(58) Field of Classification Search .......... 717/104–106, 717/113, 123–125; 711/101, 117, 107
See application file for complete search history.

(56) References Cited

U.S. PATENT DOCUMENTS

| | | | | |
|---|---|---|---|---|
| 5,758,160 A * | 5/1998 | McInerney et al. | ........... | 717/104 |
| 5,787,465 A * | 7/1998 | Jouppi et al. | ........... | 711/117 |
| 5,966,532 A * | 10/1999 | McDonald et al. | ........... | 717/105 |
| 5,987,564 A * | 11/1999 | Yoneda et al. | ........... | 711/108 |
| 6,093,215 A * | 7/2000 | Buxton et al. | ........... | 717/107 |
| 6,094,702 A * | 7/2000 | Williams et al. | ........... | 711/101 |
| 6,754,885 B1 * | 6/2004 | Dardinski et al. | ........... | 717/113 |
| 6,968,346 B2 * | 11/2005 | Hekmatpour | ........... | 715/235 |
| 7,089,530 B1 * | 8/2006 | Dardinski et al. | ........... | 717/105 |
| 7,111,278 B1 * | 9/2006 | Siska, Jr. | ........... | 717/106 |
| 7,159,198 B1 * | 1/2007 | Ip et al. | ........... | 716/106 |
| 7,174,520 B2 * | 2/2007 | White et al. | ........... | 716/136 |
| 7,475,000 B2 * | 1/2009 | Cook et al. | ........... | 703/14 |
| 7,483,913 B2 * | 1/2009 | Hekmatpour | ........... | 716/100 |
| 7,574,690 B2 * | 8/2009 | Shah et al. | ........... | 717/104 |
| 7,669,187 B2 * | 2/2010 | Liu et al. | ........... | 717/124 |
| 7,712,056 B2 * | 5/2010 | White et al. | ........... | 716/136 |
| 7,774,723 B2 * | 8/2010 | Banerjee | ........... | 716/119 |
| 7,818,489 B2 * | 10/2010 | Karamcheti et al. | ........... | 711/101 |
| 7,900,186 B2 * | 3/2011 | Lucassen et al. | ........... | 717/104 |
| 7,984,420 B2 * | 7/2011 | Eldridge et al. | ........... | 717/108 |
| 7,990,927 B2 * | 8/2011 | Choi et al. | ........... | 370/335 |

FOREIGN PATENT DOCUMENTS

CN     1973290 A     5/2007

(Continued)

OTHER PUBLICATIONS

Yang et al, "Efficient register mapping and allocation in Latte an open source Java just in time compiler", IEEE Trans. on Parallel & Dist. Sys, vol. 18, No. 1, pp. 57-69, 2007.*

(Continued)

*Primary Examiner* — Anil Khatri
(74) *Attorney, Agent, or Firm* — Knobbe, Martens, Olson & Bear, LLP

(57) ABSTRACT

In one aspect, a software application for facilitating design of a register specification is provided. The application comprises an interface adapted to receive input from a user indicating information about at least one register in the register specification, the interface generating register information based on the received input, a translator coupled to the interface to receive the register information and adapted to convert the register information to an internal representation, and at least one filter adapted to transform the internal representation into at least one respective output format.

42 Claims, 16 Drawing Sheets

FOREIGN PATENT DOCUMENTS

WO    WO 2005/022338    3/2005

OTHER PUBLICATIONS

Meng et al, "Structure reuse methodology based on XML schema for functional level design a case study in configuration register module", IEEE, pp. 146-150, 2009.*

Chiu et al, "Design of a novel SIMD architecture by fusing operations and registers", ACM ICS, pp. 503-504, 2009.*

Mansouri et al, "Accounting for various register allocation schema during post synthesis verification of RTL designs", ACM pp. 1-8, 1999.*

Chip Design Magazine, "Denali Launches Blueprint, New Software for System-on-Chip Design Pragmatic ESL Product Increases Efficiency, Quality of Complex Chip Designs," Product News, Aug. 8, 2005, 2 pages, chipdesignmag.com/print.php?articleID=142?issueID=0.

Denali Software, Inc., "System RDL & Blueprint™," printed Dec. 1, 2006, 3 pages, denali.com/products/blueprint_rdl.html.

Denali Software, Inc., "Silverback Systems Plans Deployment of Denali Blueprint," Oct. 3, 2005, 2 pages, denali.com/news_pr20051003b.html.

Denali, "System Register Description Language (SystemRDL)," Denali Software, Inc. Palo Alto, California, May 26, 2006, pp. 1-49.

Chinese Office Action from corresponding Chinese Patent Application No. 200810126220.3, Aug. 23, 2011, 7 pages.

* cited by examiner

```xml
<?xml version="1.0" encoding="UTF-8" ?>
<!-- ******************************************************** -->
<!-- Saved by Coda - Version 1.0: Build: 2006 08 14 -->
<!-- Copyright (c) 08-14-2006 Analog Devices Inc. -->
<!-- Analog Devices Inc. Confidential. All rights reserved -->
<!-- ******************************************************** -->
<!-- $Id$ -->
<module acronym="ALTPIN" TYPE="DESIGN" MAKE="STD" TOP="false" dest="" MODULENO="3">
<module-name>ALTPIN</module-name>
<description>Pin Muxing </description>
<declarations/>
<module-data>
<address type="absolute" radix="x">80054000</address>
<memoryAccessMethod>MMR</memoryAccessMethod>
<waitStates>0</waitStates>
<register visibility="Public" strobe="NONE" reset="NONE" acronym="PU_PD">
<description>Pin Pull-Up and Pull-Down</description>
<access mode="RW" />
<width>16</width>
<address type="absolute" radix="x">8004C010</address>
<undefinedBit value="0" />
<field acronym="PUP_SDDAT">
<description>PUPSDDAT</description>
<width>1</width>
<position>0</position>
<access mode="RW" />
<enum default="1" format="x">
```

FIG. 13A

```xml
<literal value="1">Enables MC_DAT 2 to 0, MC CMD pull-up devices </literal>
    </enum>
  </field>
  <field acronym="PUP_SDDAT3">
    <description> PUP SDDAT3 </description>
    <width>1</width>
    <position>1</position>
    <access mode="RW" />
    <enum default="0" format="x">
      <literal value="1">Enables MC_DAT3 pull-up device </literal>
    </enum>
  </field>
  <field acronym="PUP_KEY">
    <description> PUP KEY</description>
    <width>1</width>
    <position>2</position>
    <access mode="RW" />
    <enum default="1" format="x">
      <literal value="1">Enables KeypadRow[4:0] pull-up devices. Enables GPIO[35:33] if the corresponding pin mux control bit(s) is (are) set to select the KeypadRow[7:5] function (ALT1).</literal>
    </enum>
  </field>
  <field acronym="PUP_NWAIT">
    <description> PUP NWAIT</description>
    <width>1</width>
    <position>3</position>
    <access mode="RW" />
```

FIG. 13B

```xml
<enum default="1" format="x"/>
<literal value="1">Enables nWAIT pull-up device </literal>
</enum>
</field>

<field acronym="PUP_GPIO22">
<description>PUP_GPIO22 </description>
<width>1</width>
<position>4</position>
<access mode="RW" />
<enum default="1" format="x"/>
<literal value="1">Enables GPIO22 pull-up device</literal>
</enum>
</field>
```

METHODS AND APPARATUS FOR AUTOMATION AND FACILITATING DESIGN OF REGISTER MAPS

FIELD OF THE INVENTION

The present invention relates to the design of register maps, and more particularly, to simplifying and/or automating certain aspects of the design process.

BACKGROUND OF INVENTION

System-on-Chip (SoC) design often requires the design and management of hundreds or thousands of registers, including register specification and description, generation of control register logic, verification, system tests, etc. In may circumstances, specifying and managing configuration registers constitutes a substantial portion of chip design with respect to time, cost and resource allocation. The term "register" as used herein, encompasses various terminology used in the art including, but not limited to, configuration and status registers (CSR), control registers, design control registers, configuration registers, etc.

In conventional chip design, the various tasks associated with the design and management of registers is handled manually. For example, typical chip design involves a number of stages including: 1) a specification stage in which registers may be described in a document style specification based on, for example, various design requirements and input from marketing; 2) a design stage in which the register specification may be implemented, for example, using any of various hardware description languages (HDL) such as Verilog, VHDL, etc.; 3) a verification stage to test the created register design; and 4) a silicon stage in which a fabricated chip is system tested using hardware input vectors.

FIG. 1 illustrates a flowchart of conventional SoC design. Typically, the design process begins by writing a specification for the chip design (e.g., register specification 120). Register specification 120 may be generated by the system architect in connection with input from marketing and in view of various design requirements and concerns. For example, the register specification may be generated based in part to satisfy marketing requirements 110a and design requirements 110b. The system architect or design team typically generates the register specification in a selected presentation format such as a word processor format (e.g., Microsoft® Word®), other presentation format such Microsoft® PowerPoint®, spreadsheet, or a web-publishing format such as hypertext mark-up language (HTML), which may be easily converted into a portable document format (PDF) file that can be shared amongst the design team and/or customers, posted on the Internet, etc.

The completed register specification may then be distributed to various engineering teams for implementation. For example, hardware design engineers 130a may generate HDL descriptions of the register maps from the register specification document. Hardware verification engineers 130b may design verification tasks based on the register specification and the HDL descriptions created by the design engineers. Similarly, software engineers 130c may generate code based on the register specification document. After the various engineering teams have completed their design tasks, the design is verified and tested to expose hardware and/or software bugs or other errors in the design. For example, the completed design may undergo hardware verification/testing 140a and software verification/testing 140b.

Errors discovered during verification/testing are reported back to the architecture team and the register specification is modified accordingly. For example, hardware bugs 145a and software bugs 145b are reported so that register specification 120 may be updated to appropriately reflect the bug fixes. The modified specification may then be distributed again to the engineering design teams and the process is repeated until the design is complete and substantially error free. In addition, new input from marketing or additional design requirements may be received at any point during the design phase, requiring update to the register specification documents and further design by the engineering teams to implement the updated register specification.

In such conventional design flows, the different stages of development may be largely unsynchronized and often performed manually and independently of the other stages. For example, different individuals or different teams may be assigned responsibility for each of the different stages. Errors exposed at one of the stages may then require extensive work in each of the other stages, which in turn requires one or more different teams to correct the portions of the design for which they are responsible. As such, engineers spend relatively significant time and resources making changes, fixing bugs and ensuring that all changes made by other groups or personnel are implemented. In addition, conventional design flows are vulnerable to circumstances where versions of the register design are out of sync. For example, bug fixes made by a hardware engineer and/or software engineer may not immediately be incorporated into the specification document. Similarly, changes made to the specification document made not immediately be incorporated into the code base of the engineers. Accordingly, much time and resources may be necessary to ensure that the various design groups are in sync, and working from the same version of the register specification.

SUMMARY

Some embodiments include a software application for facilitating design of a register specification, the application comprising a user interface adapted to receive input from a user indicating information about at least one register in the register specification, the interface generating register information based on the received input, a translator coupled to the interface to receive the register information and adapted to convert the register information to an internal representation, and at least one filter adapted to transform the internal representation into at least one respective output format.

Some embodiments include a method of designing a register specification comprising inputting, via a user interface, information about at least one register in the register specification, generating register information based on the received input, translating the register information to convert the register information to an internal representation, and transforming the internal representation into at least one respective output format.

Some embodiments include a computer readable medium encoding instructions capable of being executed on one or more processors, the instructions, when executed, performing a method of generating a register specification based on input provided by a user, the method comprising providing a user interface for receiving input about at least one register for the register specification, generating register information based on the received input, translating the register information to an internal representation, and transforming the internal representation into at least one respective output format.

BRIEF DESCRIPTION OF THE DRAWINGS

FIG. 13 illustrates a portion of the internal representation in extended mark-up language (XML) generated by a translator for a module defined via a user interface, in accordance with some embodiments of the present invention.

DETAILED DESCRIPTION

Figure 1:
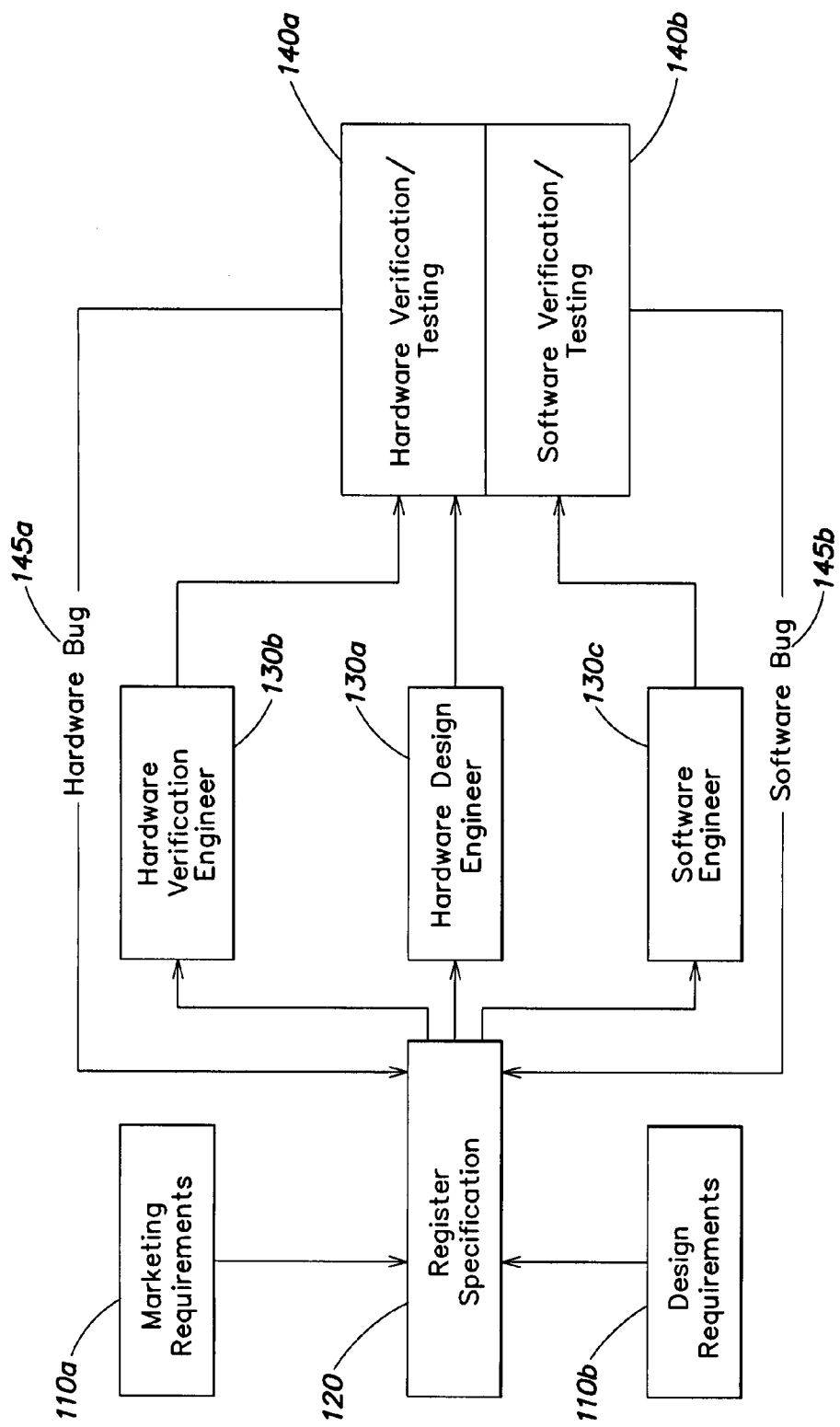
FIG. 1 illustrates a conventional design flow for designing a digital circuit including a register map.

As discussed above, conventional chip design includes a number of design stages that may be largely unsynchronized. The various stages in the design process may be handled manually and substantially independent of the other stages. Correcting errors and generally debugging the design using conventional techniques may therefore be time intensive, tedious, and vulnerable to human error. Applicant has appreciated that automating and/or synchronizing one or more of the design stages may substantially reduce the time and cost of designing and ultimately releasing a product.

In particular, in conventional design flows, changes at any stage in the design process may require reworking at other stages in the design process. For example, an update to a register definition resulting from detecting a bug in the design by a hardware or software engineer, or reworking of the specification documents to satisfy new design requirements or changes suggested by marketing may require the new register definition to be propagated to the different design teams. In particular, hardware engineers may have to update RTL code, software engineers may have to update header files or other code and application engineers may have to update customer datasheets, internal documentation, etc. Thus, each change made to the design may require significant work from other groups, engineers or personnel.

In addition, in conventional design flows, the various engineers (e.g., hardware engineers, software engineers, application engineers, etc.) typically incorporate changes made to the register specification by hand. Thus, each engineer may have to code changes made to the register specification in the particular format that the engineer is using (e.g., Verilog, VHDL, C, C++, etc.). As a result, the same information is often generated multiple times in multiple different languages. Not only is this expensive from the perspective of time and resources (and in errors that may occur from manual updating, engineer fatigue, etc.), but additional time is required to ensure that the various teams are in sync with respect to updating their respective code base, and to make sure all members of the design team are working from the same version of the register specification.

To reduce or avoid the time and resource overhead of keeping various members of a design team in sync, Applicant has developed a software application that provides a single point through which changes and/or updates to a given design are made. In one embodiment, a user interface is provided that allows a designer to define the original specification and to make updates/changes to the design. The original specification and any updates/changes can be propagated from the user interface to ensure that engineers working at various stages of the design flow are operating on the same version of the design.

To reduce the time and resources necessary to implement the original design or to propagate updates/changes to the design, the software application may include a translator that converts the register specification defined via the user interface into an internal representation. Accordingly, the internal representation may provide an updated version of the design specification from which all members of the design team can work with confidence that they are implementing an up-to-date version of the design. To reduce or eliminate redundancy of generating the register specification in different formats, languages, etc., the software application may include one or more filters that automatically convert the internal representation into one or more desired output formats. Thus, changes made to the design/register specification may be automatically propagated in the format desired by the respective engineers and/or members of the design team.

Following below are more detailed descriptions of various concepts related to, and embodiments of, methods and apparatus according to the present invention. It should be appreciated that various aspects of the invention described herein may be implemented in any of numerous ways. Examples of specific implementations are provided herein for illustrative purposes only. In addition, the various aspects of the invention described in the embodiments below may be used alone or in any combination, and are not limited to the combinations explicitly described herein.

Figure 2:
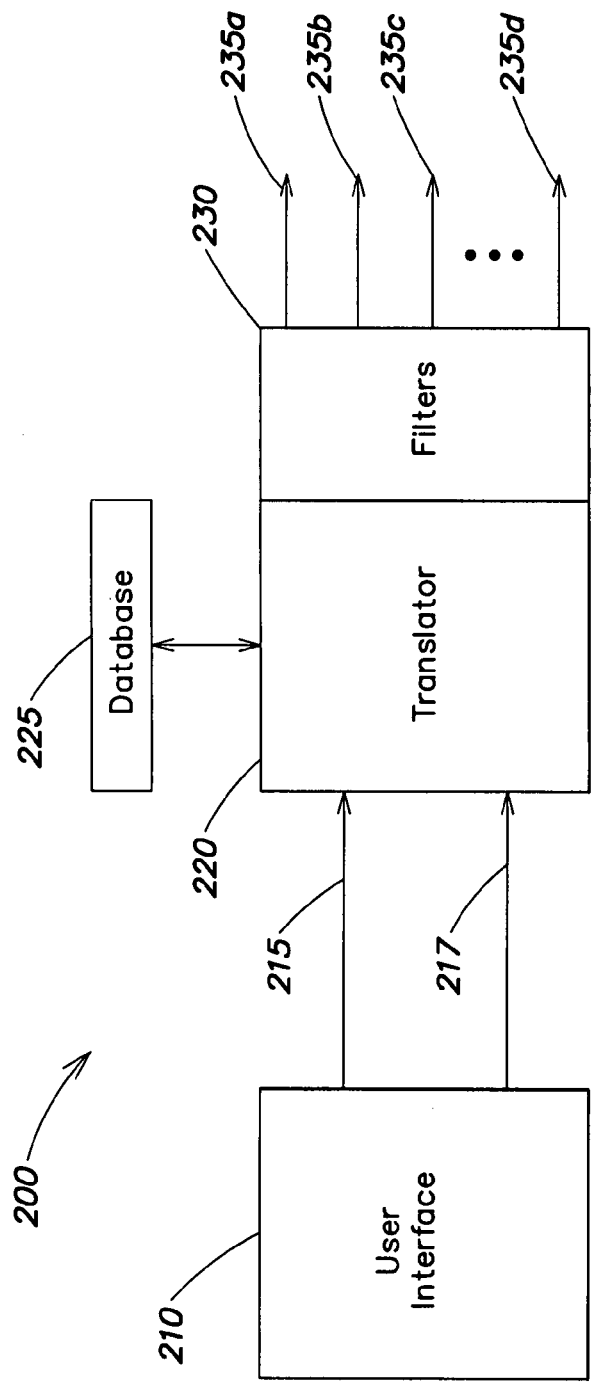
FIG. 2 illustrates a software application that facilitates the design of a register specification, in accordance with some embodiments of the present invention.

FIG. 2 illustrates a software application that facilitates the design of a register specification, in accordance with some embodiments of the present invention. In particular, the software application may assist in providing a generally coordinated and efficient design of relatively simple or complex register specifications. Application 200 comprises a user interface 210 to allow a user (e.g., a system architect or other engineer responsible for design and specification of a register map) to specify the register specification of a desired design, a translator 220 to convert the register specification to an internal representation, and filters 230 to output the register specification in one or any combination of available formats 235, as described in further detail below.

User interface 210 may be any user interface that allows a user to input a register specification. In some embodiments, the user interface 210 is a graphical user interface (GUI) that provides a generally intuitive presentation allowing a user to build a register specification in a generally hierarchical manner. In other embodiments, the user interface 210 is a register description language (RDL) that can be used to define a register specification. Applicant has appreciated that learning and mastering an RDL may be inconvenient and/or a substantial barrier to acceptance and/or use of the application by members of a design team. Thus, user interface 210 may preferably be a graphical user interface such that the application can be used by anyone without having to learn and "code" a register specification in a particular RDL.

User interface 210 may be configured to present functionality that assists the user in defining a register map in a generally hierarchical fashion. For example, in a SoC design, a top level of the hierarchy may include definition of the various buses in the system. At a next level, one or more modules comprised of registers may be defined and the connections to any one or combination of buses specified. The term "module" refers herein to any collection of registers, typically grouped together to implement particular functionality. The number of modules that are specified may depend on the design and/or the complexity of the system. At a next level in the hierarchy, each of the registers may be defined and specified for each module. User interface 210 may include additional hierarchy levels such as functionality that permits defining bit-fields for registers specified in each of the modules, and/or functionality that permits specifying enumeration values for the defined bit-fields of the specified registers.

Making the design modular (e.g., specifying register maps within defined modules), allows modules to be re-used in alternative and/or future designs. For example, modules that have been defined and saved (e.g., compiled and stored in an internal representation, as discussed in further detail below) can be loaded into a new design that re-uses that functionality. A loaded module may also be modified to customize the module for a particular design and saved as a new module without having to define the entire module from scratch. Modularity encourages design reuse, which in turn may reduce the time and cost of implementing new designs and bringing a product to market. In addition, fashioning the interface such that a register specification may be defined in a hierarchical manner may provide a generally intuitive and effective means to efficiently input a particular design.

Figure 3:
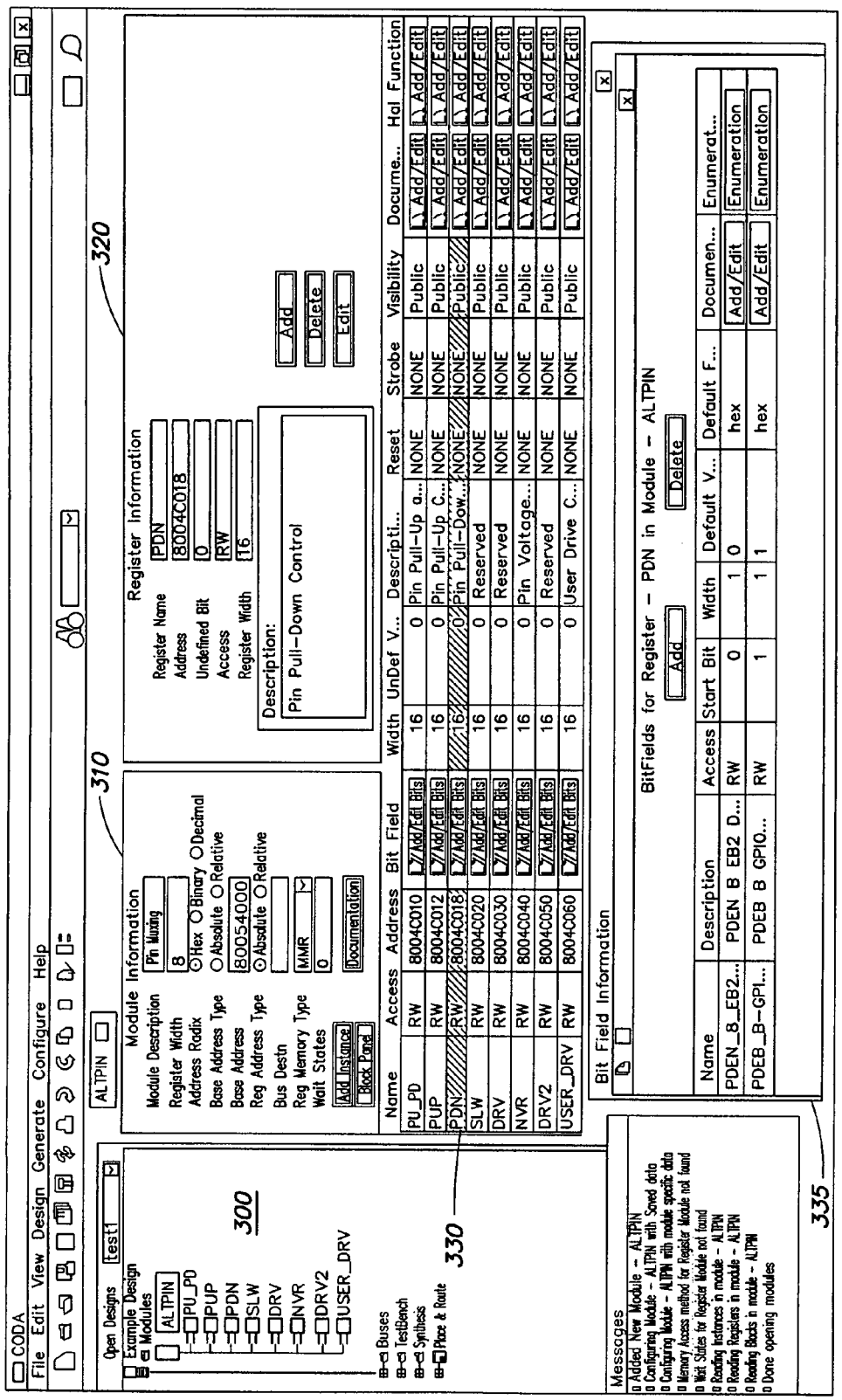
FIG. 3 is a screen shot from a graphical user interface (GUI) illustrating a user entering register information for a module in a register specification, in accordance with some embodiments of the present invention.
Figure 4:
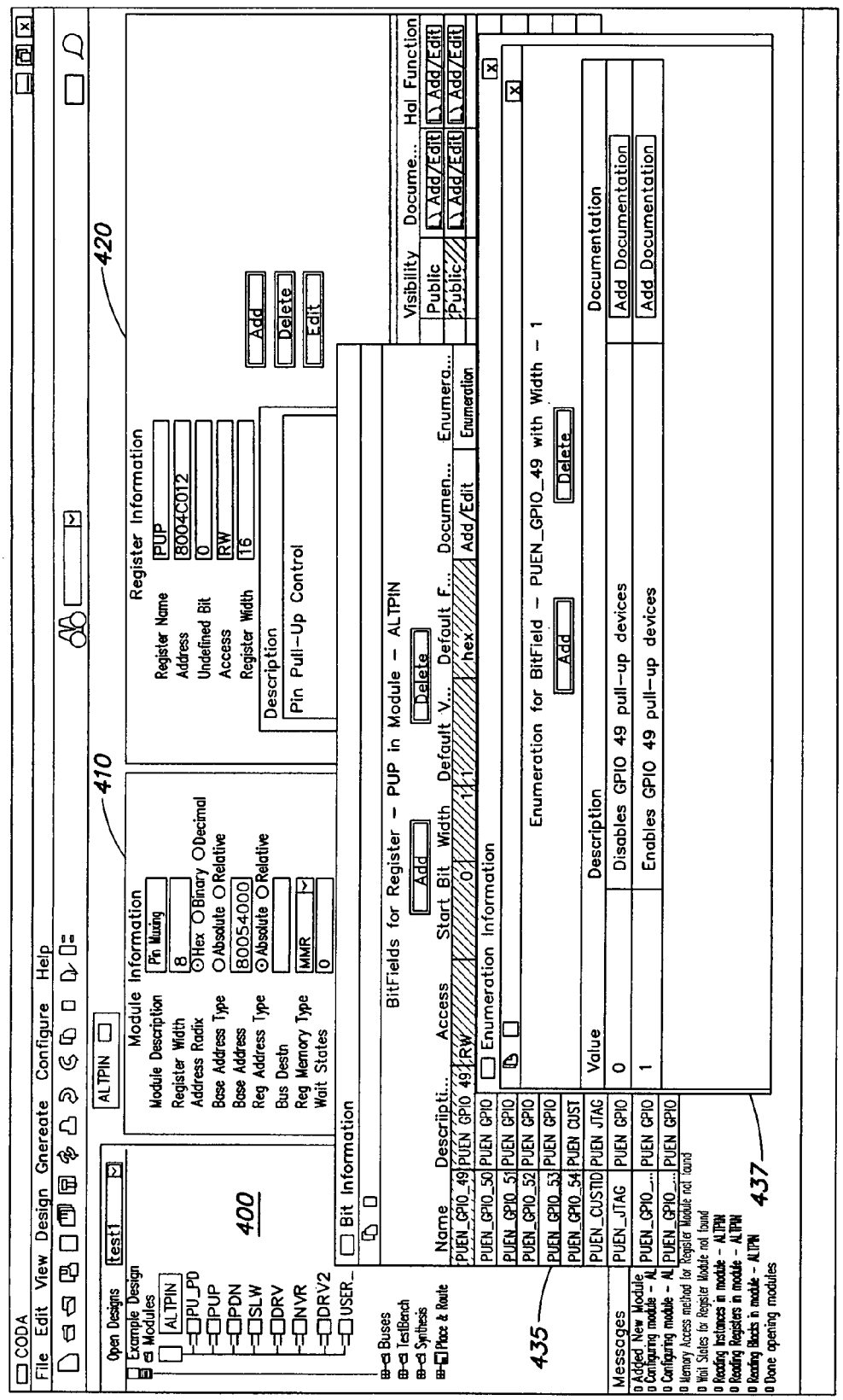
FIG. 4 is a screen shot from a graphical user interface (GUI) illustrating a user specifying enumeration information for a defined bit field of a register defined for a module, in accordance with some embodiments of the present invention.
Figure 5:
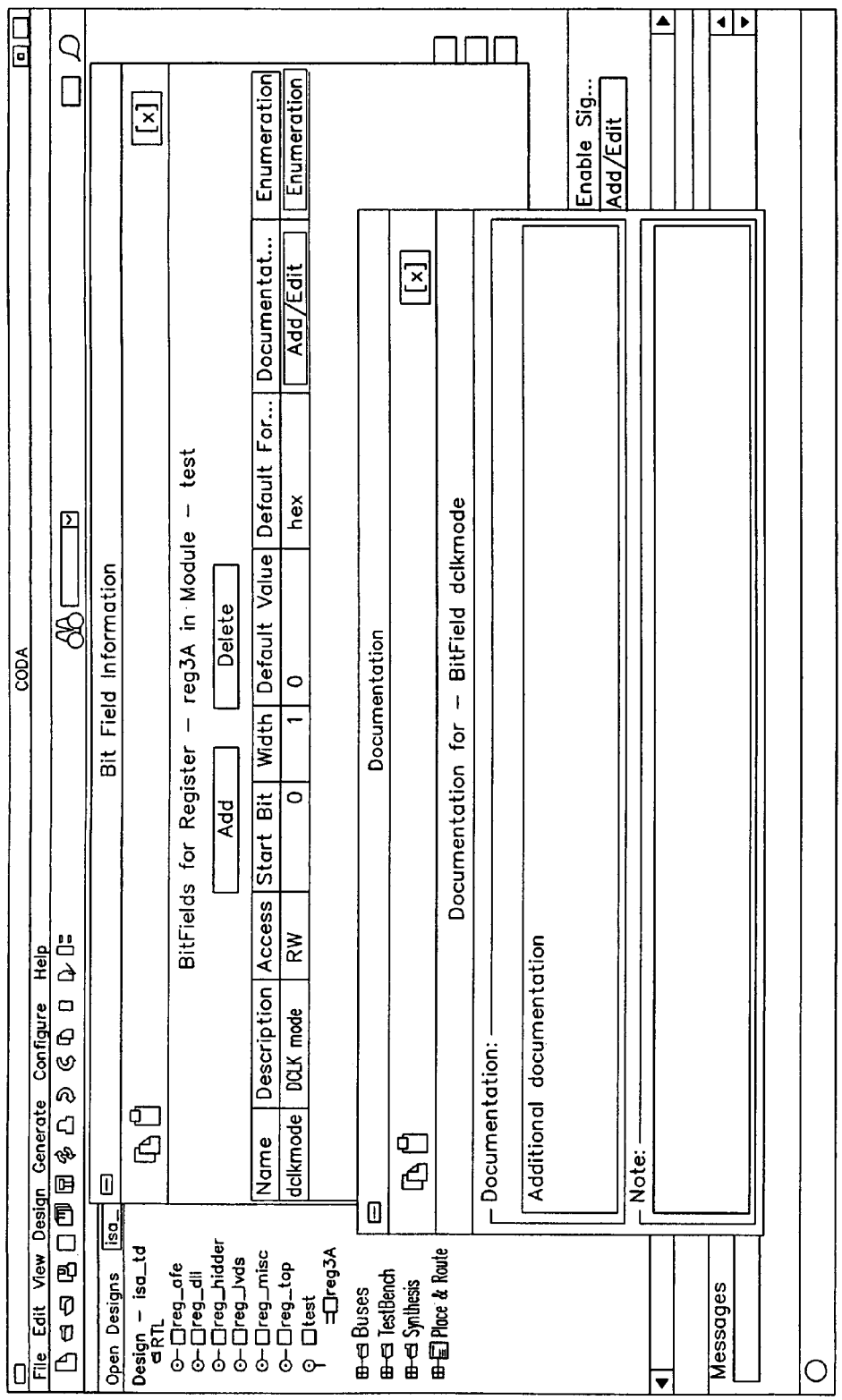
FIG. 5 a screen shot having a dialog box for entering documentation information for entering documentation information for a register specification, in accordance with some embodiments of the present invention.

As discussed above, in some embodiments, user interface 210 is a graphical user interface (GUI) that facilitates a relatively intuitive method for a designer to input a register specification without having to learn and/or master a particular RDL. FIGS. 3-5 illustrate screen shots of an exemplary GUI for entering a register specification, in accordance with some embodiments of the present invention. FIG. 3 is a screen shot illustrating a user entering register information for a module labeled "ALTPIN." For example, ALTPIN may be the first module specified in a design having multiple modules, or the ALTPIN may be the only module in the design. As indicated by the description, ALTPIN may be a module designed to achieve pin multiplexing.

Panel 300 includes a Windows® style folder hierarchy. Each folder may represent a different category for the register specification. The highest level includes a category entitled "Example Design" which includes various sub-categories that together form the design for this particular project. The sub-categories under the main category include a Modules category, a Buses category, a Testbench category, a Synthesis category and a Place and Route category. The sub-categories that appear under a new design can include any of the exemplary categories identified above, may include additional categories, or may omit any of the categories described, as the aspects of the invention are not limited in this respect. The Module category includes any modules to be defined for the Example Design, which in the snap-shot of FIG. 3 consists of the ALTPIN module which is currently selected such that the GUI provides interface functionality to allow the user to define the registers in the ALTPIN module, as discussed in further detail below.

The Buses category contains any buses that are included in the design. Not every design includes a bus, so the Buses category may remain empty for some designs. However, many designs, for example, SoC designs include one or more buses connecting various components of the system. For example, a peripheral bus (PBUS) may connect various peripheral components to a host processor, or connect one or more interfaces that receive off-chip information to the host processor or to one or more on-chip components of the system. In general, when a design includes a bus, at least one of the modules in the design will be attached to the bus. Thus, the buses, if any are defined, may be viewed as a first level in the hierarchy.

The GUI may be structured in a hierarchy to reflect the way the register information may ultimately stored, and to provide a relatively intuitive mechanism for defining a register specification. Panel 310 entitled "Module Information" permits information about the module (e.g., the ALTPIN module) to be specified. For example, panel 310, referred to herein as the Module Panel, includes spaces for a Module Description (e.g., a description reflective of the modules function), Register Width, Address Radix, Base Address Type, Base Address, Register Address Type, Bus Destination, Register Memory Type, Wait States, and a plurality of buttons, the function of which are described in further detail below.

As discussed above, a particular design may include a number of modules interconnected by one or more buses. The Module Panel permits a user to specify a bus to which the module is connected, and the base address of the connection. Whether register addresses defined for the module are absolute or relative to the base address also may be specified using the provided radio button. If register address type is selected as relative, the translator computes the address of each register defined in the module relative to the base address specified for the indicated bus destination. The Module Panel is merely exemplary and any interface that allows module level information of any type may be used, as the aspects of the invention are not limited in this respect. Each specified module may be compiled and stored in the internal representation as a separate file to facilitate re-use of design at the module level, as discussed in further detail below in connection with the description of the translator.

At the next level of the hierarchy, the GUI allows information to be specified for each register defined in the associated module. Panel 320 entitled "Register Information" allows a register to be specified. For example, panel 320, referred to herein as the Register Panel, allows the designer to input the Register Name, Address, Undefined Bit, Access (e.g., read/write, read only, etc.), Register Width, and a Description of the register. The Register Panel provides a top-level description of each specified register. Once a register has been specified, the register may be added to the module using the "Add" button provided on the Register Panel. An added register then appears in panel 330 along with the high-level information about the register. It should be appreciated that any other information and/or descriptions may be included in the top-level register description (e.g., the Register Panel may include mechanisms to input other register information), as the aspects of the invention are not limited in this respect.

In keeping with the hierarchical architecture, the GUI illustrated in FIG. 3 also permits bit-fields to be defined for each register. For example, when a register is added to panel 330, a button in a column labeled "Bit Field" is included to allow the designer to begin specifying a lower level description of the register. For example, in FIG. 3, the PDN register has been highlighted in panel 330, and the corresponding "Add/Edit Bits" button under the Bit Field column pressed, resulting in dialog box 335. Dialog box 335, referred to herein as the Bit Field Dialog Box, allows the designer to add bit field descriptions for any number of the bits in the associated register. For example, a bit field description is added for bits 0 and 1 of the PDN register. The Bit Field Dialog Box allows the user to specify the start bit and the width of each bit field. Each time a new bit field is added (e.g., via the "Add" button on the Bit Field Dialog Box) an "Enumeration" button is included in the row associated with the added bit field. The Enumeration button permits the designer to define the register at the next level down in the hierarchy, as illustrated in FIG. 4.

FIG. 4 is a screen shot of a user specifying another register labeled as "PUP" which is included in the ALTPIN module. A number of bit fields have been defined for the PUP register. The snap-shot in FIG. 4 illustrates the results after the user has selected the Enumeration button for the first defined bit field named PUEN_GPIO_49. Specifically, the Enumeration Dialog Box 437 is generated upon pressing the Enumeration button, which then allows enumeration values to be defined for the selected bit field(s). Thus, the GUI according to some embodiments allows registers in a module to be defined in a hierarchical fashion, and permits the register specification to be described in a modular fashion. This facilitates an intuitive UI that allows a designer to specify the register specification in a familiar way that may be reflective of the underlying format in which the register specification is stored (e.g., as an XML document). In addition, the hierarchical approach may promote modularity that encourages reuse. When a previously defined module is loaded for a different design, the hierarchical architecture allows the module to be modified relatively quickly and efficiently at any level to customize the module for a particular design.

It should be noted that in the GUI described above, a "Documentation" button is provided at each level of the hierarchy. Selecting the Documentation button results in a Documentation Dialog Box that allows the user to provide descriptive text of the associated entity that will be added to the documentation for the design. In particular, the documentation may be added to, for example, customer data sheets, the register specification document used by the design team, other internal documentation, etc. The information input via the Documentation Dialog Box may then be output in any desired format, as discussed in further detail below in connection with the description of the filters.

FIG. 5 illustrates the Documentation Dialog Box resulting from clicking the Documentation button at the bit field level of the hierarchy for an exemplary register design. By providing documentation capabilities at the various levels, the resulting documentation may intuitively reflect and structure of the design and the various components of the design and the different levels may be suitably described and documented. As a result, documentation may be automatically generated for the register specification that can be used for customer data sheets, the register specification document or any other internal documentation that may be desired, as discussed in further detail below.

Figure 6:
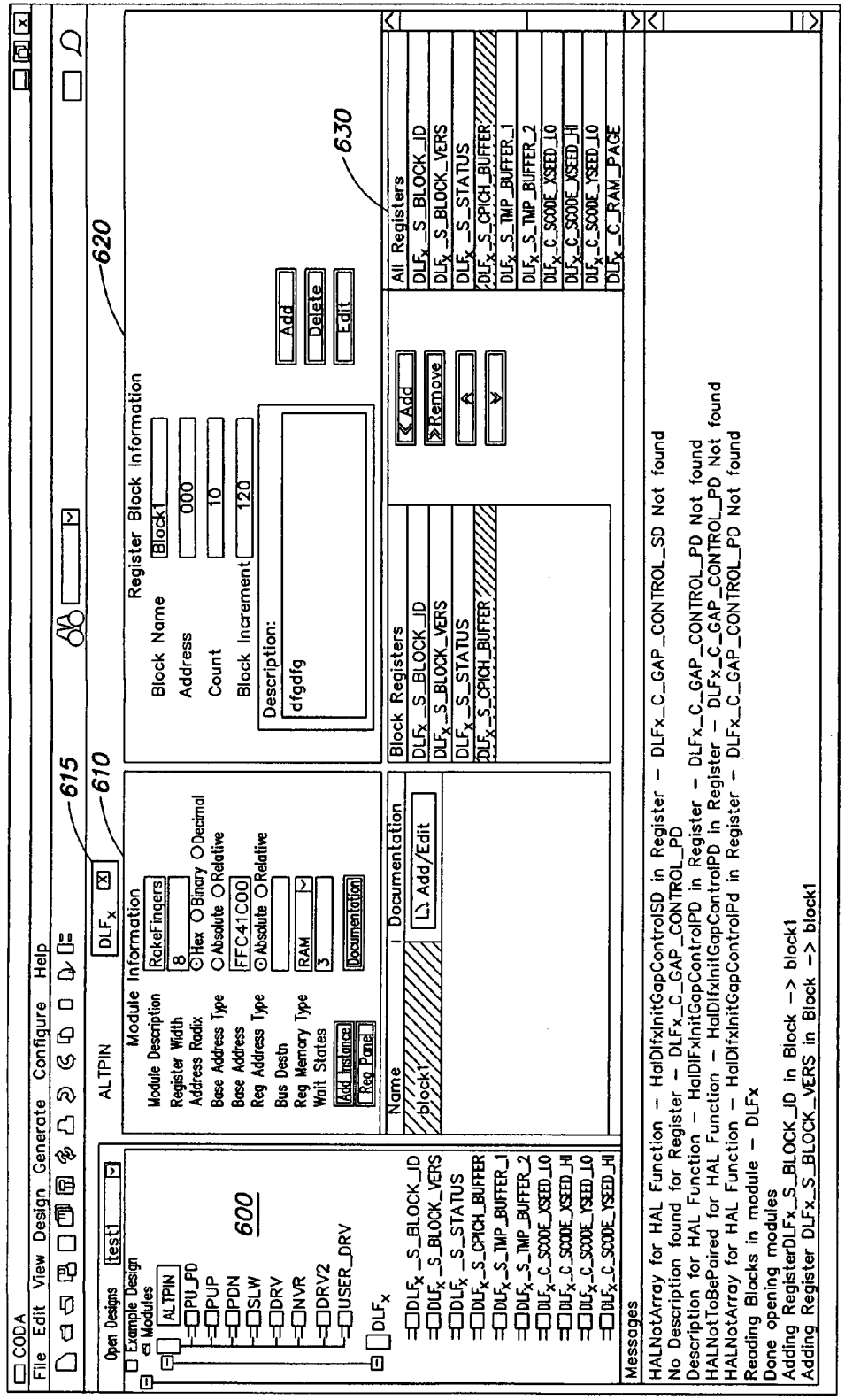
FIG. 6 illustrates GUI functionality allowing a user to define blocks of registers, in accordance with some embodiments of the present invention.

FIG. 6 is a screen shot illustrating further functionality, in accordance with some embodiments of the present invention. In particular, FIG. 6 illustrates block functionality that facilitates relatively efficient definition of blocks of similar or the same registers. As shown in the module hierarchy in panel 600, two modules have been defined for the Example Design; the ALTPIN module discussed in FIGS. 3 and 4, and a DLFx module. Tab 615 shows that the DLFx module is currently selected and being displayed. The Module Panel shows that the DLFx module is designed to implement fingers for a rake, for example, a rake receiver.

Panel 620, referred to as the Register Block Panel, displays register block information associated with register blocks defined by the designer. The Register Block Panel can be selected via buttons on the Module Panel that allows a user to toggle between the Register Panel and the Register Block Panel. In particular, in FIG. 3, the Register Panel is displayed and therefore a "Block Panel" button is visible on the Module Panel. Activating the "Block Panel" button displays the Register Block Panel as shown in FIG. 6. As a result, the Module Panel makes visible the "Reg Panel" button to allow the user to quickly toggle to the Register Panel if desired.

The Register Block Panel allows a user to define blocks of registers. It is common in various designs (e.g., SoC designs) to have large blocks of registers that are essentially the same as one another. However, defining these blocks using conventional methods (e.g., defining them by hand in the original specification and then reproducing them in various programming languages) is tedious, time consuming and error prone. Even defining large blocks of similar or the same registers using the Register Panel as described above in connection with FIG. 3 may take longer than necessary. For example, suppose a particular design calls for a block of registers having four registers, but the same block of four registers is repeated ten times in the design. When using conventional manual design or using the Register Panel, forty individual registers would need to be coded or input, respectively. The Register Block Panel allows the four registers to be defined once and then repeated at a desired interval, saving the designer significant time and tedium, and perhaps resulting in fewer errors that will need to be discovered and fixed at some later stage of the design process at potentially significant expense.

The Register Block Panel includes text boxes to input the name of a block being defined ("Block Name"), the base address of the block ("Address"), the number of times the block is to be repeated ("Count"), and the address offset or increment of the block ("Block Increment"). Panel 630 displays all of the registers that have been defined for the current module (i.e., via the Register Panel). Any of the defined registers can be added or removed from the block using the "Add" and "Remove" buttons, respectively. As a result, the registers in repeated blocks of registers need only be specified once and then added to a block which can be repeated as many times as the design requires. It should be appreciated that register blocks can be specified in other ways, as the aspects of the invention are not limited in this respect.

While only some exemplary capabilities and functionality of a UI are illustrated in the screen shots illustrated and described above, it should be appreciated that any functionality or capabilities may be built into a UI to assist in defining a desired register specification, as the aspects of the invention are not limited in this respect. It should be further appreciated that the GUI may include any functionality or any capabilities that are desired to facilitate a generally intuitive interface to allow a desired register design to be defined. In particular, features that allow a user to generate designs ranging from simple to complex with relatively little training may be generally preferable. However, any UI that allows at least a register map to be input or otherwise specified may be used, as the aspects of the invention are not limited in this respect. Moreover, while a hierarchical and/or modular approach may be preferable, other types of UI design may be used.

Referring again to FIG. 2, UI 210 (however implemented) receives information from a user about the register specification and provides register information 215 to the translator. That is, the register information defined by the user is provided, in some desired format, to translator 220. Translator 220 receives the register information 215 and converts the information into an internal representation that can be stored (e.g., in a database), converted to other formats, and/or generally used to facilitate downstream stages of the design effort. Translator 220 also may receive flags 217 indicating which type of outputs are desired, as discussed in further detail below in connection with filters 230.

In some embodiments, the internal representation includes the extensible markup language (XML). That is, the translator converts the information input via the user interface into an XML document that can be stored in database 225. XML's structured format lends itself well to describing modular, hierarchical relationships such as a register specification. In addition, the ubiquity, general purpose, Internet protocol friendly nature of XML provides for an internal representation that facilitates data sharing (e.g., display of the register specification via a webpage), conversion to other formats, etc. However, XML is merely one exemplary representation that may be suitable and any internal representation may be used, as the aspects of the invention are not limited in this respect. For example, the internal representation may be an RDL, HTML, etc.

Software application 200 includes, or may access, a database to store the internal representation of the register specification. The database may be part of the translator, or external storage accessible by the translator (or other component of the software application). The translator may be configured to generate a separate file for each module defined via UI 210 and store the files in database 225. Translating and storing modules as separate files facilitates building a library of modules that can be re-used, modified for a particular design, or otherwise employed to quickly build a register specification for a desired design. However, the translator may be configured to generate and store the internal representation of a particular design in other ways (e.g., the translator may generate a single file for an entire design), as the aspects of the invention are not limited in this respect.

FIG. 13 shows a portion of the internal representation for the ALTPIN module generated by translator 220. In the embodiment in FIG. 13, the internal representation is XML and translator 220 converts the register information input via UI 210 to an XML document representing the ALTPIN module. In particular, translator 220 obtains the hierarchically defined register information and places the register information in an XML structure with the appropriate structured tags. It should be appreciated that FIG. 13 shows only a portion of the XML document generated by the translator for the ALTPIN module.

Filters 230 are configured to convert the internal representation of the register specification into the various outputs 235 indicated by flags 217, specified by default value, or indicated by other means. In particular, UI 210 may be configured to display output options to the user so that outputs in the desired formats are generated after the register specification has been compiled. In some embodiments, the output formats may be indicated in other ways than via UI 210, such as command line flags, default values, etc. Filters 230 may include any filter configured to convert the internal representation into any desired format. For example, the user may indicate to filters 230 (e.g., via flags 217) to generate C or C++ files for software engineers to facilitate software design, testing and verification, Verilog files for hardware engineers to facilitate hardware design, testing and verification, or any other format used by members of a design team during design, testing and/or verification.

Filters 230 may also include one or more filters to convert the internal representation into a presentation document (e.g., into a Word®, PowerPoint®, or other presentation format). For example, customer datasheets may be automatically generated as well as the register specification document used internally by the design team. Filter 230 may be configured to generate hypertext markup language (HTML) documents to publish the register specification on a web page that can be viewed via a browser from any location.

It should be appreciated that filters 230 may be part or an extensions of translator 220, or may be separate modules (e.g., filters 230 may be Perl scripts that parse the internal representation and generate documents in the desired format). Filters 230 may be implemented in any way, for example, as executable programs, scripts, plug-ins, linked libraries, or any other set of instructions that convert the internal representation into a desired format. Filters 230 may include filters to generate files in any desired format, as the aspects of the invention are not limited in this respect. The filters may facilitate automatic updates of various documents and file formats throughout the design process as the register specification is modified/updated to ensure that the various members of the design team are in-sync and working from the same version of the register specification. The filters may eliminate the need to manually code changes to the register specification each time the design is updated.

Application 200 facilitates synchronizing the design process. In particular, bugs in the register specification discovered during hardware and/or software testing and verification can be fixed via UI 210. The translator may then convert the new register specification to the internal representation and filters 230 generate the desired output formats. Accordingly, the various files and formats may be automatically and simultaneously updated. UI 210 provides a unitary entry point to modifying the register specification, and the database may operate as a central repository that can be iterated on in a synchronized fashion until the design has been fully tested and verified. As a result, the initial design of the register specification may created without having to "code" the design or generate a specification document by hand (both relatively time consuming and error prone processes). In addition, any changes to the design specification (e.g., due to the discovery of bugs, or due to changes in design requirements or marketing input) can be quickly (and automatically) incorporated into downstream stages of the design.

Figure 7:
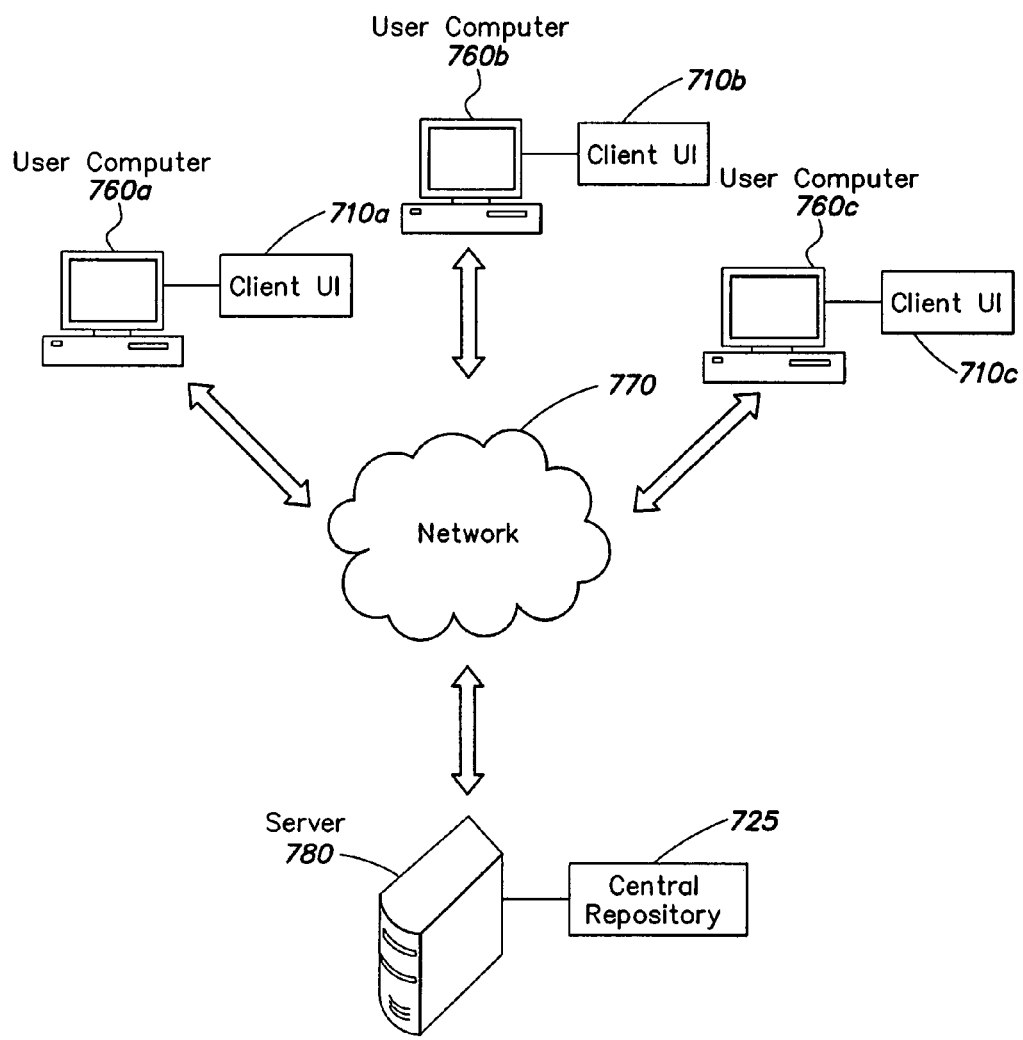
FIG. 7 illustrates a networked computer system having a distributed application configured to facilitate the design of a register specification, in accordance with some embodiments of the present invention.

In some embodiments, software application 200 may be a distributed network program to facilitate coordinated design efforts by a design team. FIG. 7 illustrates a networked computer system on which a distributed application for designing a register specification may be implemented, in accordance with some embodiments of the present invention. The networked computer system comprises a plurality of computers 760. The computers may be the desktop computers or workstations of various users collaborating on a particular design. Computers 760 may each be connected to network 770, for example, a corporations local area network (LAN). Also, connected to the network is a server 780 accessible by computers 760 over the network. It should be appreciated that that server 780 may be one of the computers 760, for example, a desktop computer or workstation connected to the network, or may be a designated server on the LAN.

Server 780 may include central repository 725 for storing data in the internal representation of a register specification, or individual modules of a register specification generated by users of the distributed application. Each of computers 760 may include a client UI 710. The client application may be a standalone application installed on the respective computer and capable of communicating with the central repository, or may be a web-based application that users can access via a browser. In any event, the client application includes a UI adapted to receive input from the user indicative of a desired register specification. For example, client UI may be similar to UI described in connection with FIG. 2, or the GUI illustrated in the snapshots if FIGS. 3-6. However, client UI may be any interface accessible by a user at a computer 760 that permits the user to input a register specification, as the aspects of the invention are not limited in this respect.

The distributed application also may include a translator to convert the register specification input via client UI 710 into an internal representation that is then stored at server 780 in central repository 725. The translator may be part of the client UI or located at the server as part of the central repository. In case of the former, the register information provided via the UI may be compiled at the client computer and the internal representation sent to the central repository over the network. In case of the latter, the register information may be transmitted to the central repository over the network and compiled at the server and saved in the central repository. Similarly, the distributed application may include one or more filters to convert the internal representation into a desired input format, the filters being located either at the client or the server.

The distributed application facilitates generally simultaneous work by a design team collaborating on a particular design. In particular, each user may work on his/her part of the design without worrying that the design is being changed without the knowledge of other parties. That is, the central repository may store the latest version of the register specification from which members of the design team can simultaneously implement their work. To this end, the central repository may include various mechanisms to ensure that files being modified by two or more parties don't overwrite the changes/updates made by others. As a result, the design team can be confident that the copy of the design stored at the central repository is up-to-date and that all parties are in sync (e.g., working with the same version of the register specification). Any changes made by any member of the design team can be automatically converted into an updated internal representation and/or updated output format. The distributed application is one exemplary implementation that may facilitate coordinating the design process. However, the software application need not be distributed over a network, as the aspects of the invention are not limited in this respect.

Integrated processor (IP) design often requires large numbers of registers to be defined and connected appropriately with the rest of the processor. It is often the case that an IP design will require one or more interfaces for communicating with devices off-chip. For example, the Serial Peripheral Interface (SPI) and the Inter Integrated Circuit ($I^2C$) interface are two common serial interfaces used to exchange information between, for example, an on-chip processor and one or more off-chip devices, processors, etc. Applicant has appreciated that adding such common features to an IP design may be facilitated by creating a library of templates that facilitate relatively quick and efficient implementation of various standard components/features of IP design.

Figure 8A:
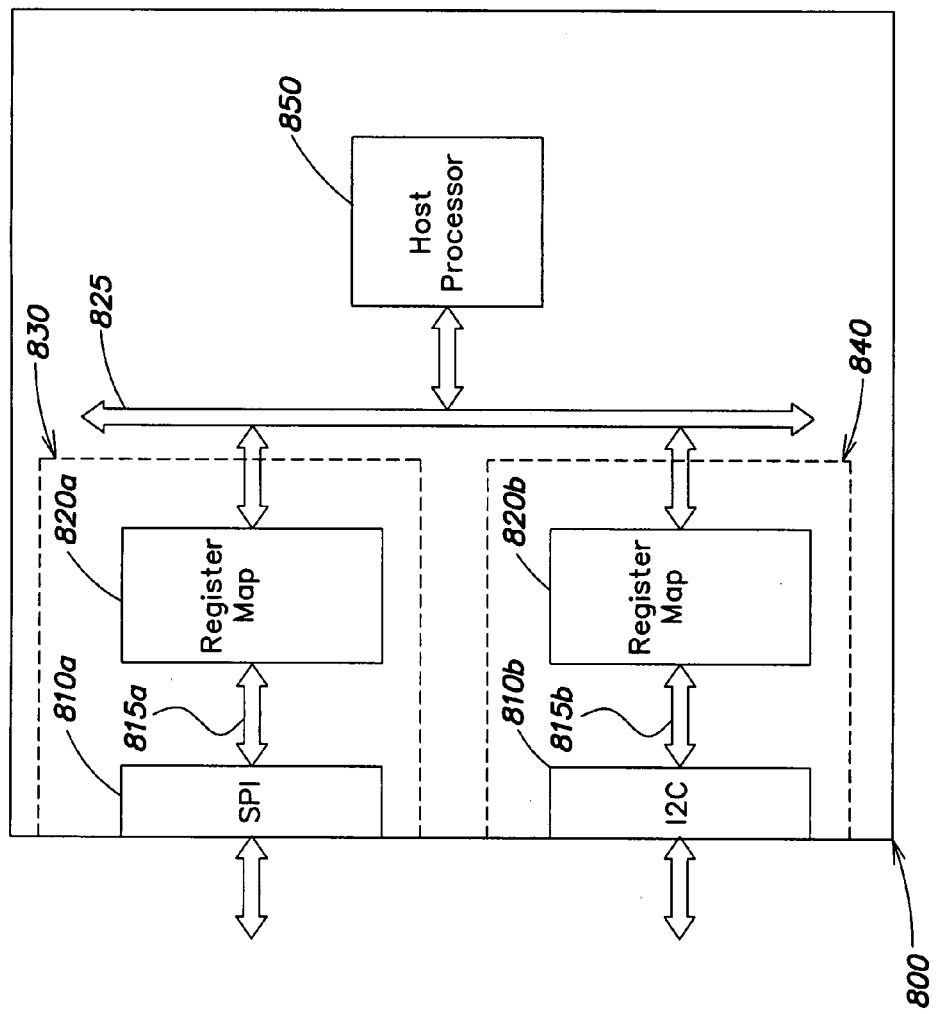
FIG. 8A illustrates a silicon-on-chip (SoC) design having an Serial Peripheral Interface (SPI) and a Inter Integrated Circuit ($I^2C$) interface, in accordance with some embodiments of the present invention.

FIG. 8A illustrates a block diagram of an IP design. Chip 800 includes a host processor 850, a peripheral bus (PBUS) 825 for communication between the host processor and any peripherals on the chip, an SPI interface 830 and an $I^2C$ interface 840. In FIG. 8A, two serial interfaces are shown to illustrate different possibilities for communicating off-chip. A given IP design may support only one of the two serial interfaces, or may include an interface operating according to another standard, as the aspects of the invention are not limited in this respect. The SPI interface includes SPI 810*a* denoting, for example, the pins or ports at which external (e.g., off-chip) signals are transmitted on-chip and vice-versa. The SPI interface also includes register map 820*a* which operates as a buffer for signals transmitted on and off-chip between the ports and PBUS 825. Similarly, the $I^2C$ interface includes $I^2C$ 810 denoting the pins or ports at which signals are transmitted on and off-chip, and register map 820*b* for buffering the signals.

Figure 8B:
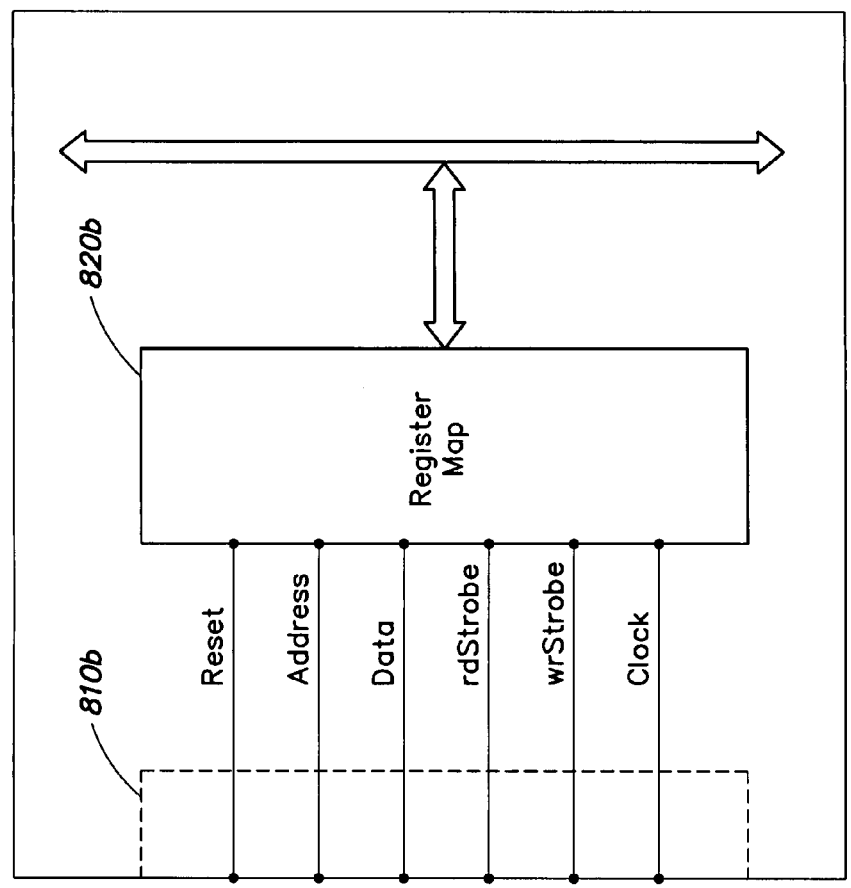
FIG. 8B illustrates the ports for the $I^2C$ interface illustrated in FIG. 8A.

Applicant has developed a library of templates (e.g., an SPI template, an $I^2C$ template, etc.) that quickly instantiate various standard components to allow the designer to define the connections to the register map. For example, templates for serial interface templates, when selected, may automatically instantiate the proper port connections, allowing the designer more efficiently define the register map associated with the selected serial interface. FIG. 8B is a block diagram of the ports of the $I^2C$ interface. $I^2C$ 810*b* includes ports for Reset, Address, Data, rdStrobe, wrStrobe and Clock. The $I^2C$ interface and the SPI interface are both well known and available standards and will not be discussed in detail herein, except to say that each interface requires a set of specified ports that control the exchange of information between on-chip and off-chip devices. Applicant has appreciated that permitting a designer to select a desired template (e.g., a serial interface template) via the interface and automatically instantiate the ports according to the associated standard allows the designer to immediately begin defining the register map used to transfer the signals received at the ports to components on-chip (e.g., used to transfer signals to a bus connected to the various components), and to transfer signals received from on-chip components off-chip.

Figure 9:
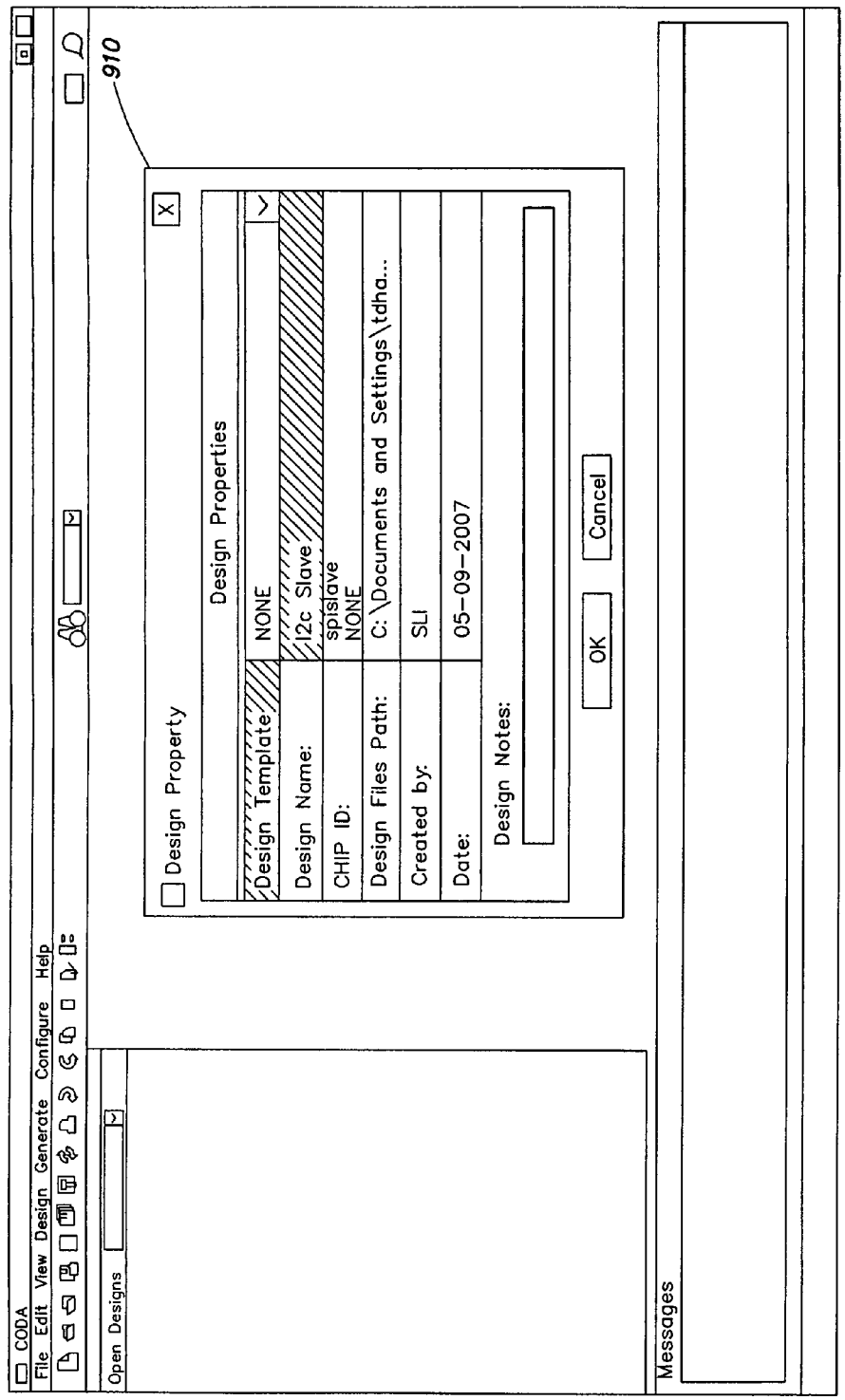
FIG. 9 is a screen shot illustrating GUI functionality for loading a template into a design, in accordance with some embodiments of the present invention.
Figure 10:
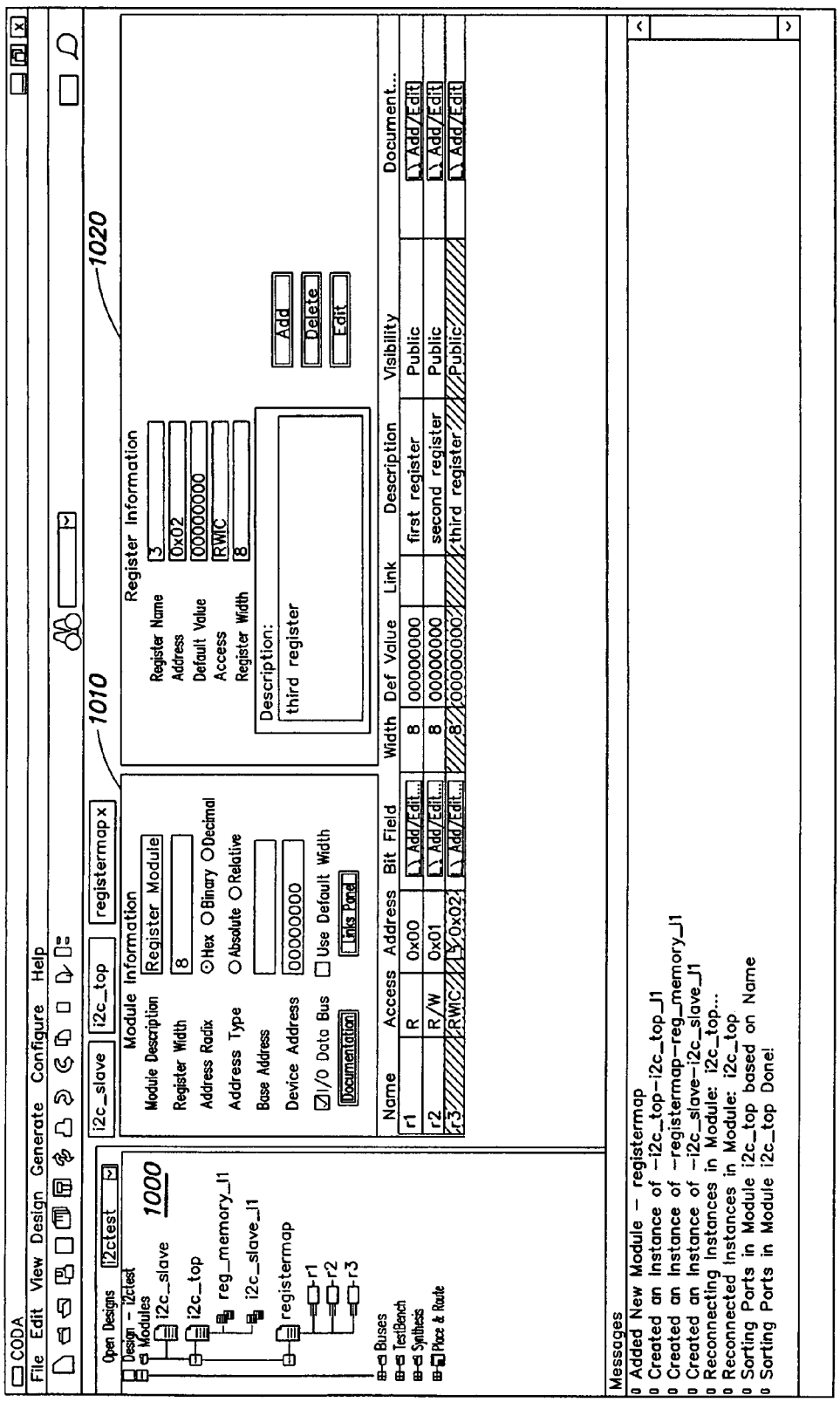
FIG. 10 is a screen shot illustrating top-level information automatically provided after opening a $I^2C$ interface template, in accordance with some embodiments of the present invention.
Figure 11:
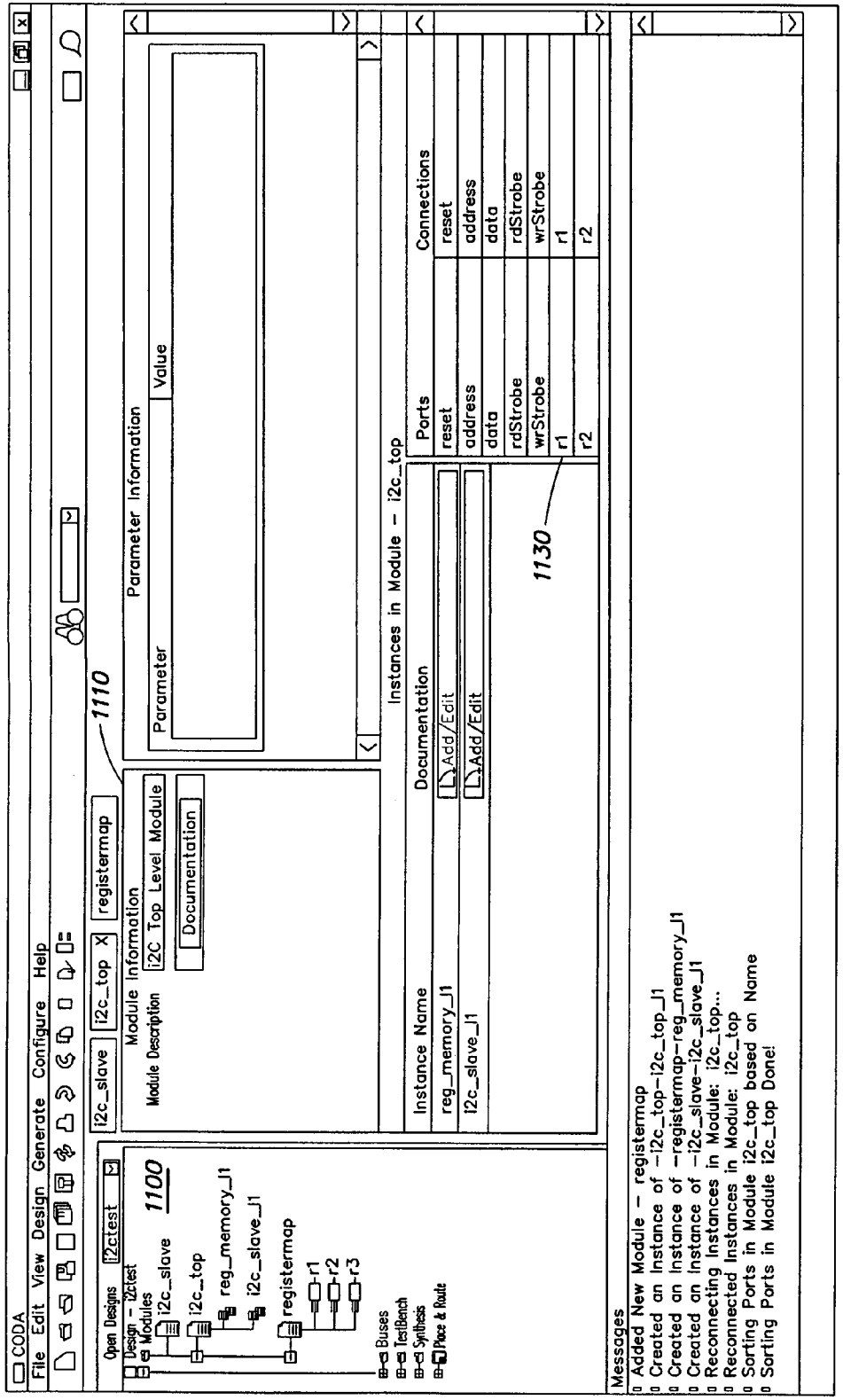
FIG. 11 is a screen shot illustrating GUI functionality for adding registers to a register map and defining connections to the loaded $I^2C$ interface template, in accordance with some embodiments of the present invention.

FIGS. 9-11 are screen shots of graphical user interface functionality that allows a designer to select a template from a library of templates, in accordance with some embodiments of the present invention. FIG. 9 illustrates a dialog box 910 that allows the designer to choose a template from the templates currently available in the template library. As illustrated, the library includes templates for an i2cslave (i.e., a template instantiating $I^2C$ ports with which to connect appropriate registers) and an spislave (i.e., a template instantiating SPI ports with which to connect appropriate registers). It should be appreciated that any number of templates may be developed and added to the library, as the aspects of the invention are not limited in this respect.

According to some embodiments, activating the interface template creates ports and connections for the interface and an empty shell for the register map. The designer may then proceed to define the registers of the register map and appropriately connect them to the interface ports. FIG. 10 illustrates the results of selecting an i2cslave template. As shown in panel 1000, the template generates a top level (i2c_top) and a register map. The designer may add in and define registers to the empty register map, for example, by adding and specifying register characteristics as described in the foregoing (e.g., as illustrated in FIGS. 3-6). In the screen shot of FIG. 10, the designer has specified and defined three registers, r1, r2 and r3. FIG. 11 illustrates the top level view of the i2cslave. The top level view shows registers added to the register map and how the instances are being connected. Thus, a serial interface may be quickly and efficiently designed via the UI. Other ways of facilitating often repeated design features through templates may be used as well, as the aspects of the invention are not limited in this respect.

Figure 12:
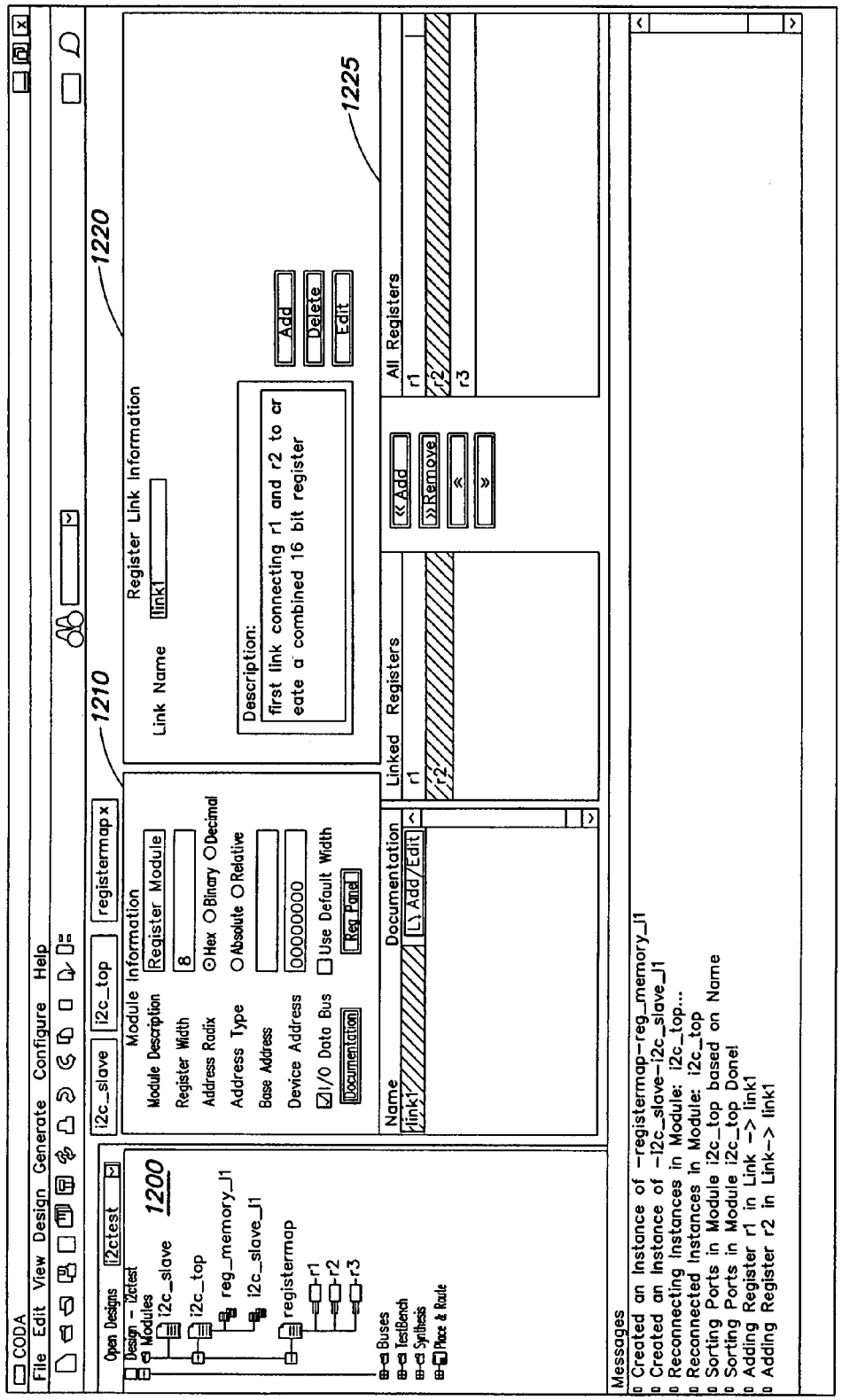
FIG. 12 is a screen shot illustrating GUI functionality for linking registers to create register having a desired width, in accordance with some embodiments of the present invention.

In some circumstances, it may be desirable to link registers to create a register of greater width. For example, in a module consisting of 8-bit registers it may be desirable to expose at the top level one or more registers having a greater width (e.g., 16 bits, 32 bits, etc.). In some embodiments, the GUI allows registers to be linked to give the appearance at the top level of a register of greater width. FIG. 12 is a screen shot illustrating GUI functionality that allows a designer to link two more registers together to create larger width registers. FIG. 12 illustrates the register map specified in FIG. 11. Included in the screen shot is Register Link Panel 1220 that permits linking of two or more registers. Panel 1225 lists all of the registers that have been created in the register map and allows the designer to add/remove registers to be linked. For example, for the defined "link1," registers r1 and r2 are linked to create a 16-bit register. It should be appreciated that any number of registers may be linked together to create a register of any width, as the aspects of the invention are not limited in this respect.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. It should be appreciated that any component or collection of components that perform the functions described above can be generically considered as one or more controllers that control the above-discussed function. The one or more controller can be implemented in numerous ways, such as with dedicated hardware, or with general purpose hardware (e.g., one or more processor) that is programmed using microcode or software to perform the functions recited above.

It should be appreciated that the various methods outlined herein may be coded as software that is executable on one or more processors that employ any one of a variety of operating systems or platforms. Additionally, such software may be written using any of a number of suitable programming languages and/or conventional programming or scripting tools, and also may be compiled as executable machine language code.

In this respect, it should be appreciated that one embodiment of the invention is directed to a computer readable medium (or multiple computer readable media) (e.g., a computer memory, one or more floppy discs, compact discs, optical discs, magnetic tapes, etc.) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

It should be understood that the term "program" is used herein in a generic sense to refer to any type of computer code or set of instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. The invention is capable of other embodiments and of being practiced or of being carried out in various ways. In particular, the various concepts related to variable radiation energy and variable radiation intensity may be used in any way, either alone or in any combination, as the aspects of the invention are not limited to the specific combinations described herein. Accordingly, the foregoing description and drawings are by way of example only.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

What is claimed is:

1. An apparatus for facilitating design of a register specification, the apparatus comprising:
an electronic database configured to store one or more internal representations of register information; and
one or more configured computing devices in communication with the electronic database, the one or more configured computing devices operative to:
provide a graphical user interface (GUI) adapted to receive input from a user that permits a user to define registers in the register specification in a first hierarchical structure having a plurality of levels and to repeat registers in a block within the first hierarchical structure, the block including registers in the register specification, wherein each register in the block of registers is defined via the GUI at least once;
generate register information based on the received input;
translate the register information to a new register level internal representation;

store the new register level internal representation in the electronic database; and transform the new register level internal representation into at least one output format.

2. The apparatus of claim 1, wherein the first hierarchical structure includes a first level for specifying a register module as part of the register specification, the register module including a plurality of registers.

3. The apparatus of claim 2, wherein the first hierarchical structure includes a second level for defining register level information for each of the plurality of registers in the register module.

4. The apparatus of claim 3, wherein the first hierarchical structure includes a third level for defining bit fields for selected ones of the plurality of registers defined in the register module.

5. The apparatus of claim 4, wherein the first hierarchical structure includes a fourth level for defining an enumeration for each bit field defined for the selected ones of the plurality of registers defined in the register module.

6. The apparatus of claim 2, wherein the one or more configured computing devices are further operative to generate a separate document in the new register level internal representation for each module defined in the register specification.

7. The apparatus of claim 1, wherein the new register level internal representation has a second hierarchical structure that reflects the first hierarchical structure.

8. The apparatus of claim 7, wherein the new register level internal representation includes extensible mark-up language (XML).

9. The apparatus of claim 1, wherein the database is capable of storing a plurality of internal representations corresponding to a respective plurality of register specifications input by the user via the interface.

10. The apparatus of claim 9, wherein the new register level internal representation includes extensible mark-up language (XML) and the database is adapted to store a plurality of XML documents.

11. The apparatus of claim 9, wherein the database stores a library accessible by the user interface, the library storing at least one template corresponding to a standard component.

12. The apparatus of claim 11, wherein the at least one template includes at least one serial interface template.

13. The apparatus of claim 12, wherein the at least one template includes a Serial Peripheral Interface (SPI) template and an Inter Integrated Circuit ($I^2C$) template.

14. The apparatus of claim 13, wherein the SPI template includes connections for ports defined by an SPI standard, and wherein the $I^2C$ template includes connections for ports defined by an $I^2C$ standard.

15. The apparatus of claim 12, wherein the at least one serial interface template includes connections for ports defined by a respective serial interface standard, and provides an empty register map to be defined by the user.

16. The apparatus of claim 15, wherein one or more configured computing devices are further operative to allow a user to link two or more registers to create a linked register having a desired width.

17. The apparatus of claim 1, wherein the at least one filter includes a filter capable of converting the internal representation into at least one hypertext markup language (HTML) document.

18. The apparatus of claim 1, wherein the at least one output format includes a Verilog file.

19. The apparatus of claim 1, wherein the at least one output format includes a Word document.

20. The apparatus of claim 1, wherein the at least one output format includes at least one of a C and a C++ file.

21. The apparatus of claim 1, wherein the at least one output format includes a portable document format (PDF) document.

22. The apparatus of claim 1, wherein the GUI is configured to receive a count n indicating a number of times the block of registers is to be repeated.

23. The apparatus of claim 22, wherein the one or more configured computing devices are further operative to expand the block of registers such that the internal representation includes a representation for each register in each of the n blocks.

24. An apparatus comprising:
one or more processors; and
a computer program embodied in a non-transitory computer readable medium encoding instructions that, when executed by the one or more processors, perform a method of generating a register specification based on input provided by a user, the method comprising:
providing a graphical user interface (GUI) for receiving input to define registers in the register specification in a first hierarchical structure having a plurality of levels and to repeat registers in a block within the first hierarchical structure, the block including registers in the register specification, wherein each register in the block is defined via the GUI at least once;
generating register information based on the received input;
translating the register information to a new register level internal representation; and
transforming the new register level internal representation into at least one output format.

25. The apparatus of claim 24, wherein providing the GUI includes providing a GUI that permits a user to specify a register module as part of the register specification, the register module including a plurality of registers.

26. The apparatus of claim 25, wherein providing the GUI includes providing a GUI that permits a user to specify register level information for each of the plurality of registers in the register module.

27. The apparatus of claim 26, wherein providing the GUI includes providing a GUI that permits a user to specify bit fields for selected ones of the plurality of registers defined in the register module.

28. The apparatus of claim 27, wherein providing the GUI includes providing a GUI that permits a user to specify an enumeration for each bit field defined for the selected ones of the plurality of registers defined in the register module.

29. The apparatus of claim 25, wherein translating the register information includes generating a separate document in the new register level internal representation for each module defined in the register specification.

30. The apparatus of claim 24, wherein translating the register information includes converting the register information into at least one extensible mark-up language (XML) file.

31. The apparatus of claim 24, wherein transforming the new register level internal representation includes converting the new register level internal representation into at least one hypertext markup language (HTML) document.

32. The apparatus of claim 24, wherein transforming the new register level internal representation includes converting the new register level internal representation into at least one Verilog file.

33. The apparatus of claim 24, wherein transforming the new register level internal representation includes converting the new register level internal representation into at least one Word document.

34. The apparatus of claim 24, wherein converting the internal representation includes converting the internal representation into at least one of a C and a C++ file.

35. The apparatus of claim 24, wherein transforming the new register level internal representation includes converting the new register level internal representation into at least one portable document format (PDF) document.

36. The apparatus of claim 35, wherein translating includes expanding the block of registers such that the new register level internal representation includes a representation for each register in each of the n blocks.

37. The apparatus of claim 24, wherein providing the GUI permits a user to specify a count n indicating a number of times the defined block of registers is to be repeated.

38. The apparatus of claim 24, further comprising providing at least one template corresponding to a standard component.

39. The apparatus of claim 38, wherein providing the at least one template includes providing at least one serial interface template.

40. The apparatus of claim 39, wherein providing the at least one template includes providing at least one of a Serial Peripheral Interface (SPI) template and an Inter Integrated Circuit ($I^2C$) template.

41. The apparatus of claim 24, wherein providing the GUI includes providing a GUI that permits a user to link two or more registers to create a linked register having a desired width.

42. The apparatus of claim 24, wherein the one or more processors are distributed over a plurality of computers connected via a network such that the instructions can be executed from any of the plurality of computers connected via the network.

* * * * *